(12) United States Patent
Sano

(10) Patent No.: US 11,101,242 B2
(45) Date of Patent: Aug. 24, 2021

(54) SEMICONDUCTOR DEVICE AND METHOD OF MANUFACTURING SAME

(71) Applicant: TOSHIBA MEMORY CORPORATION, Tokyo (JP)

(72) Inventor: Yuichi Sano, Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/286,282

(22) Filed: Feb. 26, 2019

(65) Prior Publication Data

US 2020/0051957 A1 Feb. 13, 2020

(30) Foreign Application Priority Data

Aug. 7, 2018 (JP) .............................. JP2018-148775

(51) Int. Cl.
| | |
|---|---|
| *H01L 25/065* | (2006.01) |
| *H01L 25/18* | (2006.01) |
| *H01L 25/00* | (2006.01) |
| *H01L 23/00* | (2006.01) |
| *H01L 23/31* | (2006.01) |
| *H01L 23/16* | (2006.01) |
| *H01L 21/56* | (2006.01) |

(52) U.S. Cl.
CPC ........ *H01L 25/0657* (2013.01); *H01L 23/562* (2013.01); *H01L 25/18* (2013.01); *H01L 25/50* (2013.01); *H01L 2225/0651* (2013.01); *H01L 2225/06506* (2013.01); *H01L 2225/06562* (2013.01); *H01L 2225/06586* (2013.01)

(58) Field of Classification Search
CPC ....... H01L 25/0657; H01L 2225/06562; H01L 25/18; H01L 25/50; H01L 23/3142; H01L 23/562; H01L 2224/32145; H01L 25/065
See application file for complete search history.

(56) References Cited

U.S. PATENT DOCUMENTS

| | | | |
|---|---|---|---|
| 2008/0061451 A1* | 3/2008 | Huang | ................ H01L 23/3128 257/787 |
| 2008/0265443 A1 | 10/2008 | Imoto et al. | |
| 2010/0103634 A1 | 4/2010 | Funaya et al. | |
| 2013/0062782 A1 | 3/2013 | Yoshimura et al. | |
| 2014/0070428 A1* | 3/2014 | Tanimoto | ................ H01L 24/92 257/777 |
| 2015/0170980 A1 | 6/2015 | Kosaka et al. | |

(Continued)

FOREIGN PATENT DOCUMENTS

| | | |
|---|---|---|
| CN | 1674223 A | 9/2005 |
| CN | 102969264 A | 3/2013 |

(Continued)

*Primary Examiner* — Marcos D. Pizarro
*Assistant Examiner* — Antonio B Crite
(74) *Attorney, Agent, or Firm* — Kim & Stewart LLP

(57) ABSTRACT

A semiconductor device includes a substrate, a first semiconductor chip on the substrate, a first adhesive material on the first semiconductor chip, a spacer chip on the first adhesive material, a second adhesive material on the spacer chip, a second semiconductor chip on the second adhesive material, and a resin material that covers the first and second semiconductor chips and the spacer chip. The spacer chip has a first region with which the resin material comes in contact is roughened and a second region that is different from the first region.

16 Claims, 6 Drawing Sheets

(56) References Cited

U.S. PATENT DOCUMENTS

2015/0380377 A1   12/2015  Uzoh et al.
2017/0317000 A1*  11/2017  Nishimura .............. H01L 23/13

FOREIGN PATENT DOCUMENTS

| JP | 2011-204862 A | 10/2011 |
| JP | 2011204862 A  | 10/2011 |
| TW | 201523831 A   | 6/2015  |
| TW | 201700511 A   | 1/2017  |

* cited by examiner

SEMICONDUCTOR DEVICE AND METHOD OF MANUFACTURING SAME

This application is based upon and claims the benefit of priority from Japanese Patent Application No. 2018-148775, filed Aug. 7, 2018, the entire contents of which are incorporated herein by reference.

FIELD

Embodiments described herein relate generally to a semiconductor device and a method of manufacturing the same.

BACKGROUND

In a package for a semiconductor device such as a NAND flash memory, a plurality of semiconductor chips, such as memory chips and controller chips, are stacked using an FOD (Film On Die) technology. With the FOD technology, if an upper layer semiconductor chip (hereinafter called the upper layer chip) is miniaturized, a spacer chip is often used to enable a lower chip to be buried in an adhesive film.

Such a spacer chip is formed of a patternless mirror chip, and the surface of the mirror chip is in a mirrored surface. For this reason, the adhesive force between the spacer chip and a mold resin that seals the semiconductor chips is weak. Therefore, separation of the spacer chip and the mold resin may happen in a high-temperature and high-humidity environment, which deteriorates the reliability of the semiconductor device.

One of the solutions to prevent the deterioration is to apply polyimide onto the spacer chip. Using polyimide, however, results in an increase in a manufacturing cost.

DETAILED DESCRIPTION

Embodiments provide a semiconductor device having a package structure that can prevent peel-off of a spacer chip from a mold resin and that can be manufactured at a low cost.

In general, according to one embodiment, a semiconductor device includes a substrate, a first semiconductor chip on the substrate, a first adhesive material on the first semiconductor chip, a spacer chip on the first adhesive material, a second adhesive material on the spacer chip, a second semiconductor chip on the second adhesive material, and a resin material that covers the first and second semiconductor chips and the spacer chip. The spacer chip has a first region with which the resin material comes in contact is roughened and a second region that is different from the first region.

Embodiments according to the present disclosure will be described hereinafter with reference to the drawings. The present embodiments are not intended to limit the present disclosure. In the following embodiments, a vertical direction of a substrate represents a relative direction if it is assumed that a surface of the substrate on which semiconductor chips are provided is an upper surface, and the vertical direction may not be identical with the direction of gravitational force. The drawings are either schematic or conceptual and ratios of sections and the like are not necessarily identical to actual ones. In the specification and the drawings, similar elements to those already described with reference to the drawings already referred to are denoted by the same reference signs and description thereof is omitted as appropriate.

First Embodiment

Figure 1:
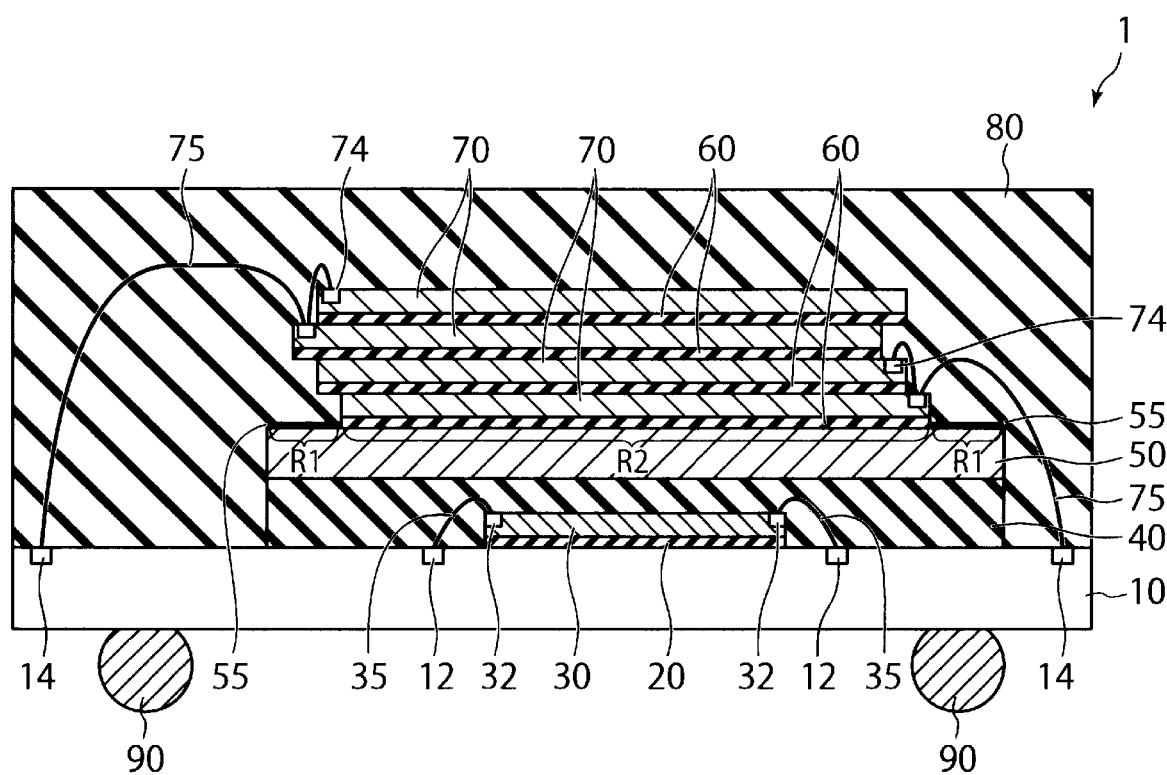
FIG. 1 is a cross-sectional view showing a configuration of a semiconductor device according to a first embodiment.
Figure 2:
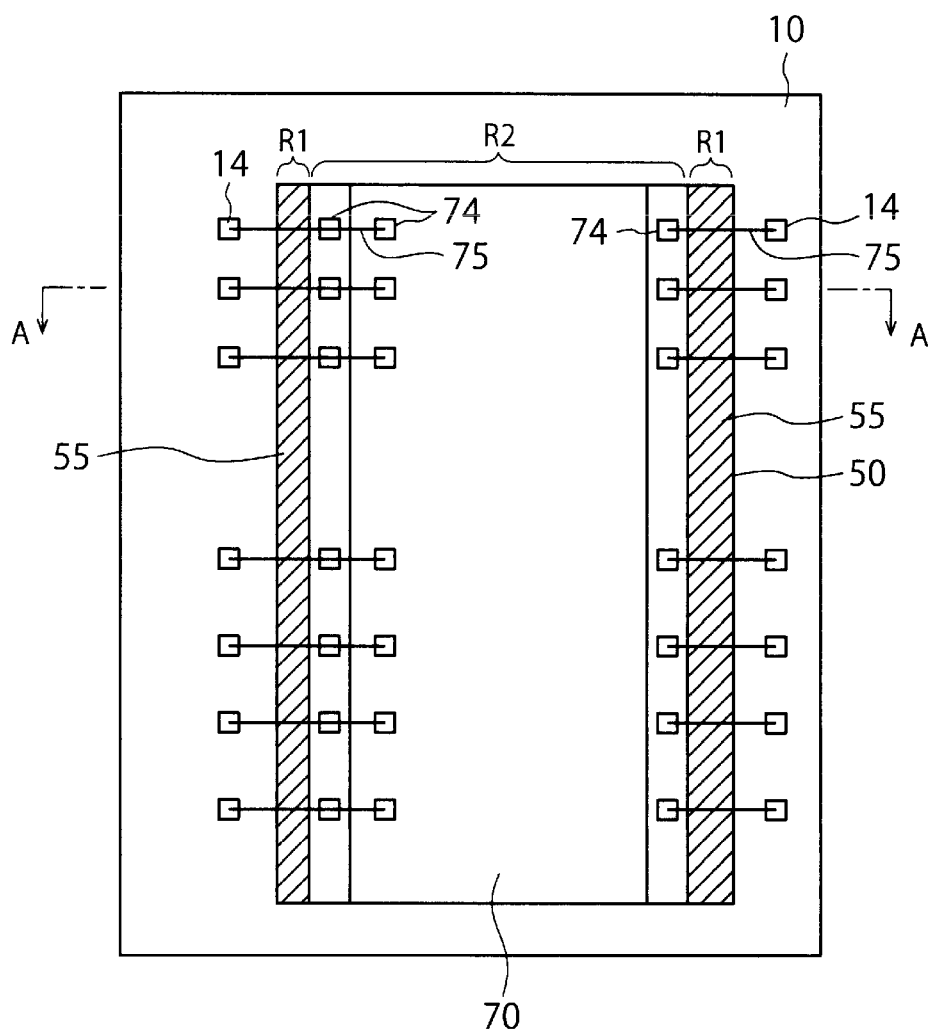
FIG. 2 is a plan view showing the configuration of the semiconductor device according to the first embodiment.

FIG. 1 is a cross-sectional view showing a configuration of a semiconductor device 1 according to a first embodiment. FIG. 2 is a plan view showing the configuration of the semiconductor device 1 according to the first embodiment. FIG. 1 is a cross-sectional view taken along a line AA of FIG. 2.

The semiconductor device 1 in the present embodiment is a surface mount semiconductor package and may be, for example, a BGA (Ball Grid Array package), a MAP (Mold Array Package), or a LGA (Land Grid Array Package). The semiconductor device 1 may be, for example, a semiconductor memory device such as a NAND flash memory.

The semiconductor device 1 includes a substrate 10, an adhesive material 20, a controller chip 30, an adhesive material 40, a spacer chip 50, an adhesive material 60, a memory chip 70, a mold resin 80, and metal bumps 90.

The substrate 10 is, for example, a multilayer interconnect substrate by stacking and integrating one or a plurality of insulating layers (not shown) and a plurality of interconnect layers (not shown). For example, a resin material such as a glass epoxy resin or a glass-BT resin (bismaleimide-triazine resin) is used for the insulating layers. The interconnect layers are provided within the substrate 10 or on front and rear surfaces of the substrate 10 and electrically connected to bonding pads 12 and 14. For example, a low-resistance conductive material such as copper is used for the interconnect layers. While a planar shape of the substrate 10 is not limited to a specific shape, the plane surface may be a generally rectangular or generally square shape.

Solder resists (not shown) are provided on the front and rear surfaces of the substrate 10. The solder resists are not provided in regions of forming the metal bumps 90 on the rear surface and the metal bumps 90 are electrically connected to the interconnect layers exposed from the solder resists. The metal bumps 90 are thereby connected to other semiconductor devices as external connection terminals. For example, a conductive material such as a solder is use for the metal bumps 90.

The controller chip 30, which is a first semiconductor chip, is attached and fixed onto the front surface of the substrate 10 by an adhesive material (DAF (Die Attach Film)) 20. The controller chip 30 is a semiconductor chip that controls the memory chip 70, and semiconductor elements (for example, transistors) configuring a control circuit are provided on a semiconductor substrate. Furthermore, the controller chip 30 has bonding pads 32 connected to the internal control circuit and the bonding pads 32 are electrically connected to the bonding pads 12 of the substrate 10 by metal wires 35. The controller chip 30 selects one memory chip 70 to and from which data is written and read and writes and reads data to and from the selected memory chip 70. It is noted that a plurality of controller chips 30 may be disposed on the substrate 10.

The adhesive material 20 is provided between the substrate 10 and the controller chip 30 and attaches the controller chip 30 to the substrate 10. For example, the adhesive film (DAF) formed from a thermosetting resin is used for the adhesive material 20.

The spacer chip 50 is provided on the adhesive material 40 and disposed above the substrate 10 and the controller chip 30 to prevent contact of the spacer chip 50 with the substrate 10 and the controller chip 30 by the adhesive material 40. As the spacer chip 50, a semiconductor substrate used in the controller chip 30 or the memory chip 70 is used. For example, the spacer chip 50 is made of a single crystal silicon formed from a silicon wafer.

A first region R1, with which the mold resin 80 comes in direct contact, of a front surface of the spacer chip 50 is roughened by being irradiated with laser light. Therefore, the first region R1 of the front surface of the spacer chip 50 is rougher than a second region R2, i.e., the region R1 has more or larger irregularities than the second region R2. Furthermore, roughening the first region R1 with the laser light in the air causes oxidizing and/or carbonizing of the first region R1 of the spacer chip 50. Therefore, a silicon oxide and/or a silicon carbide, for example, is formed in the first region R1 of the front surface of the spacer chip 50. In this way, the first region R1 of the front surface of the spacer chip 50 is roughened, as compared with the second region R2, and provided with the silicon oxide and/or the silicon carbide. Such a roughened silicon oxide and/or silicon carbide layer will be also referred to as "processed layer 55", hereinafter. The processed layer 55 in the first region R1 is larger in amount of the silicon oxide and/or the silicon carbide than that provided in the second region R2, or the processed layer 55 is larger in thickness than that in the second region R2. In the first region R1, the adhesive force between the spacer chip 50 and the mold resin 80 increases and the peel-off on an interface between the spacer chip 50 and the mold resin 80 becomes less likely.

The memory chip 70 is attached onto the second region R2 by the adhesive material 60. The adhesive material 60 is formed from, for example, a thermosetting resin as described later and well, closely attached to a silicon crystal in a mirrored state. Therefore, it is not always necessary to roughen the second region R2 of the spacer chip 50 with laser light.

In a case where the first region R1 of the front surface of the spacer chip 50 is not roughened and the processed layer 55 is not present, the front surface of the spacer chip 50 is in a mirrored state and poor in adhesiveness to the mold resin 80. Therefore, peel-off tends to occur on an interface between the first region R1 of the spacer chip 50 and the mold resin 80.

By contrast, the processed layer 55 is provided on the front surface of the spacer chip 50 in the first region R1 of the spacer chip 50 according to the present embodiment. The processed layer 55 is roughened and formed with the silicon oxide and/or the silicon carbide having many (large) irregularities. Therefore, the peel-off on the interface between the first region R1 and the mold resin 80 is becomes less likely, which improves the reliability of the semiconductor device 1.

The adhesive material 40, which is a first adhesive material, is provided between the controller chip 30 and the spacer chip 50 and between the substrate 10 and the spacer chip 50, and attaches and fixes the spacer chip 50 onto the substrate 10 and the controller chip 30. In addition, the adhesive material 40 covers and protects the controller chip 30, the metal wires 35, and the like. In this way, the semiconductor device 1 according to the first embodiment has an FOD structure. For example, an adhesive film (DAF) formed from the thermosetting resin is used for the adhesive material 40. Examples of the adhesive material 40 include an epoxy resin, a phenol resin, an acrylic resin, and a silica filler. A thickness of the adhesive material 40 is 5 μm to 150 μm.

The adhesive material 60, which is a second adhesive material, is provided between the spacer chip 50 and the memory chip 70 and attaches the memory chip 70 to the spacer chip 50. For example, an adhesive film (DAF) formed from the thermosetting resin is used for the adhesive material 60.

The memory chip 70, which is a second semiconductor chip, is provided on the adhesive material 60 and attached onto the spacer chip 50 by the adhesive material 60. The memory chip 70 is, for example, a semiconductor chip having a NAND flash memory and a two-dimensional or three-dimensional memory cell array is provided on a front surface of a semiconductor substrate. Furthermore, the memory chip 70 has bonding pads 74 connected to an internal circuit, and the bonding pads 74 are electrically connected to the bonding pads 14 of the substrate 10 by metal wires 75. The memory chip 70 is thereby electrically connected to the controller chip 30 via the metal wires 75 and 35 and the interconnects within the substrate 10 and can operate under control of the controller chip 30.

In the present embodiment, a plurality of memory chips 70 are stacked on the spacer chip 50. In this case, the plurality of memory chips 70 are each attached to the spacer chip 50 or to the different memory chip 70 right under the memory chip 70 by the adhesive material 60.

The mold resin 80 is provided on the substrate 10 and covers the controller chip 30, the spacer chip 50, the memory chips 70, and the metal wires 35 and 75. The mold resin 80 protects the controller chip 30, the spacer chip 50, the memory chips 70, and the metal wires 35 and 75 from being exposed to outside of the semiconductor device 1.

The mold resin 80 comes in direct contact with the first region R1 of the spacer chip 50. The first region R1 is roughened and oxidized and/or carbonized. Therefore, the mold resin 80 is favorably closely attached to the spacer chip 50 in the first region R1 and difficult to peel off from the spacer chip 50. While a side surface of the spacer chip 50 is not roughened with laser light, the side surface is cut by dicing and, therefore, roughened to some extent. Thus, adhesiveness between the side surface of the spacer chip 50 and the mold resin 80 is considered not to present a serious problem.

As described so far, according to the present embodiment, the first region R1 of the spacer chip 50 with which the mold resin 80 comes in direct contact is roughened by laser processing and oxidized or carbonized. This makes it possible to improve the adhesiveness between the spacer chip 50 and the mold resin 80 and prevent the peel-off of the mold resin 80 from the spacer chip 50.

A method of manufacturing the semiconductor device 1 according to the present embodiment will next be described.

Figure 3A:
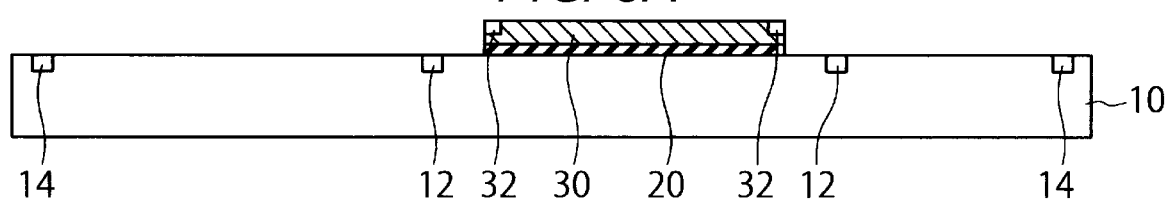
FIGS. 3A and 3B are cross-sectional views showing a method of manufacturing the semiconductor device according to the first embodiment.

FIGS. 3A to 4B are cross-sectional views showing the method of manufacturing the semiconductor device 1 according to the first embodiment. First, as shown in FIG. 3A, the controller chip 30 is placed on the substrate 10. The controller chip 30 is attached onto the substrate 10 by the adhesive material 20. The adhesive material 20 is adhesively attached to a rear surface of the controller chip 30 in advance, and attaches the controller chip 30 onto the substrate 10 by die bonding the controller chip 30 onto the substrate 10. To attach the controller chip 30 onto the substrate 10, the adhesive material 20 is heated at a time of die bonding.

Figure 3B:
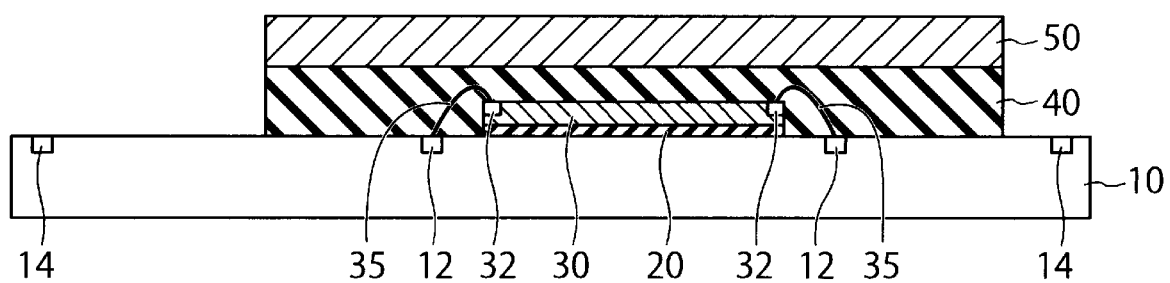

Next, as shown in FIG. 3B, the bonding pads 32 of the controller chip 30 are bonded to the bonding pads 12 of the substrate 10 by the metal wires 35. Next, the spacer chip 50 is provided above the controller chip 30. At this time, the adhesive material 40 is adhesively attached to a rear surface of the spacer chip 50 in advance, and attaches the spacer chip 50 onto the substrate 10 at a time of die bonding the spacer chip 50 onto the substrate 10. To attach the spacer chip 50 onto the substrate 10, the adhesive material 40 is heated at the time of die bonding. A front surface of the spacer chip 50 at this time is in a smoothly mirrored state.

Figure 4A:
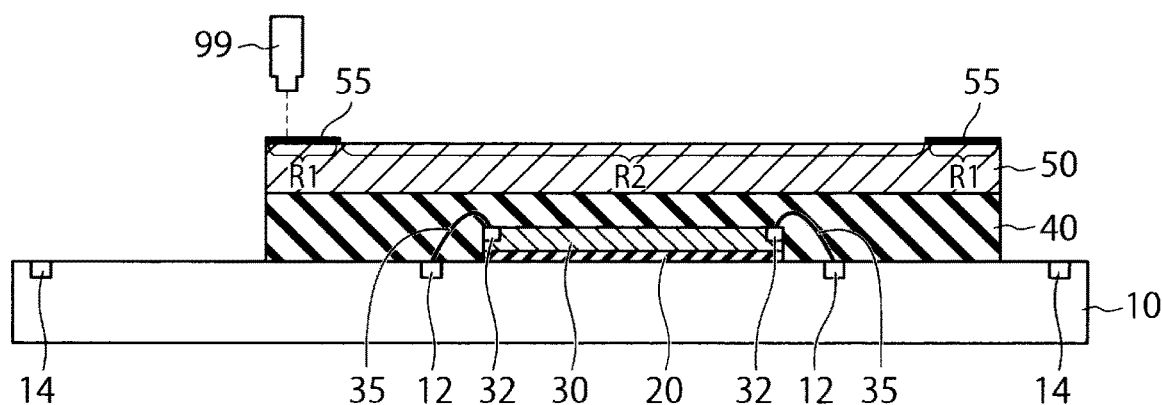
FIGS. 4A and 4B are cross-sectional views subsequent to FIG. 3 and showing the method of manufacturing the semiconductor device.

Next, as shown in FIG. 4A, the first region R1 of the spacer chip 50 is irradiated with the laser light to roughen the first region R1 of the spacer chip 50. In the present embodiment, the first region R1 is a region along a periphery of the spacer chip 50 on which the memory chips 70 are not placed. A laser apparatus 99 irradiates the first region R1 with the laser light to form irregularities on the front surface of the spacer chip 50 in the first region R1, and forms the processed layer 55 formed from the oxide and/or the carbide. When the spacer chip 50 is a silicon substrate, the processed layer 55 is formed from the silicon oxide and/or the silicon carbide. The processed layer 55 is not formed in the second region R2 and the spacer chip 50 in the second region R2 remains a mirrored surface.

Figure 4B:
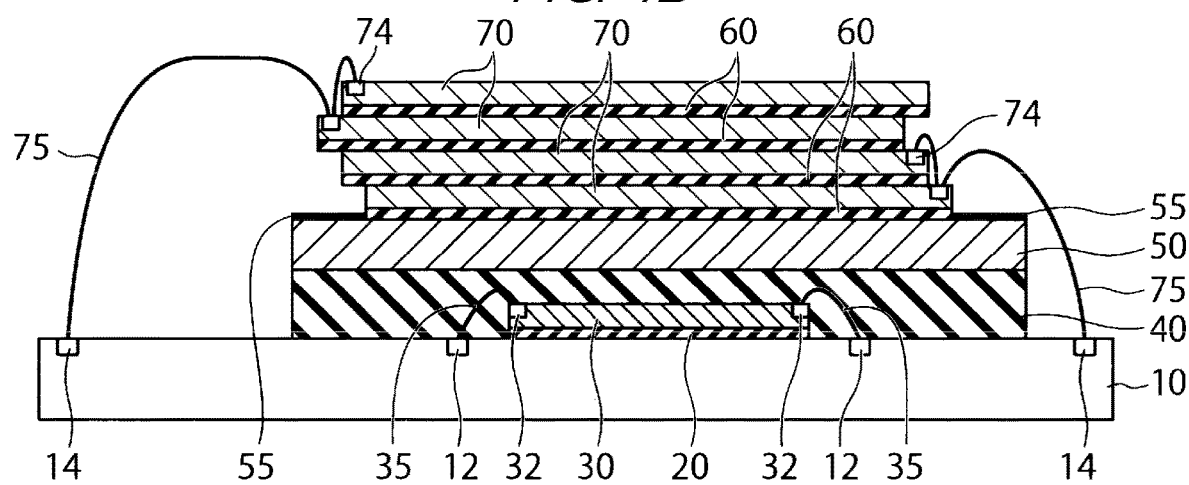

Next, as shown in FIG. 4B, one memory chip 70 is placed on the spacer chip 50. The memory chip 70 is attached onto the spacer chip 50 by the adhesive material 60. Furthermore, a different memory chip 70 is attached onto the memory chip 70 right under the different memory chip 70 by the adhesive material 60. In this way, the plurality of memory chips 70 are stacked on the spacer chip 50. The adhesive material 60 is adhesively attached to a rear surface of each memory chip 70 in advance, and attaches the memory chip 70 onto the spacer chip 50 or the different memory chip 70 by die bonding the memory chip 70 onto the spacer chip 50 or the different memory chip 70. To attach the memory chip 70 onto the substrate 10 or the different memory chip 70, the adhesive material 60 is heated at a time of die bonding.

Next, the bonding pads 74 of the memory chips 70 are bonded to the bonding pads 14 of the substrate 10 by the metal wires 75.

Next, the controller chip 30, the memory chips 70, the spacer chip 50, and the metal wires 35 and 75 are covered with the mold resin 80. The structure shown in FIG. 1 is thereby obtained. In this embodiment, at least a contact region between the mold resin 80 and the spacer chip 50 is the first region R1.

According to the present embodiment, the first region R1 of the spacer chip 50 with which the mold resin 80 comes in direct contact is roughened by the laser processing and oxidized or carbonized. This makes it possible to improve the adhesiveness between the spacer chip 50 and the mold resin 80 and prevent the peel-off of the mold resin 80 from the spacer chip 50. Therefore, the reliability of the semiconductor device 1 improves.

Second Embodiment

Figure 5:
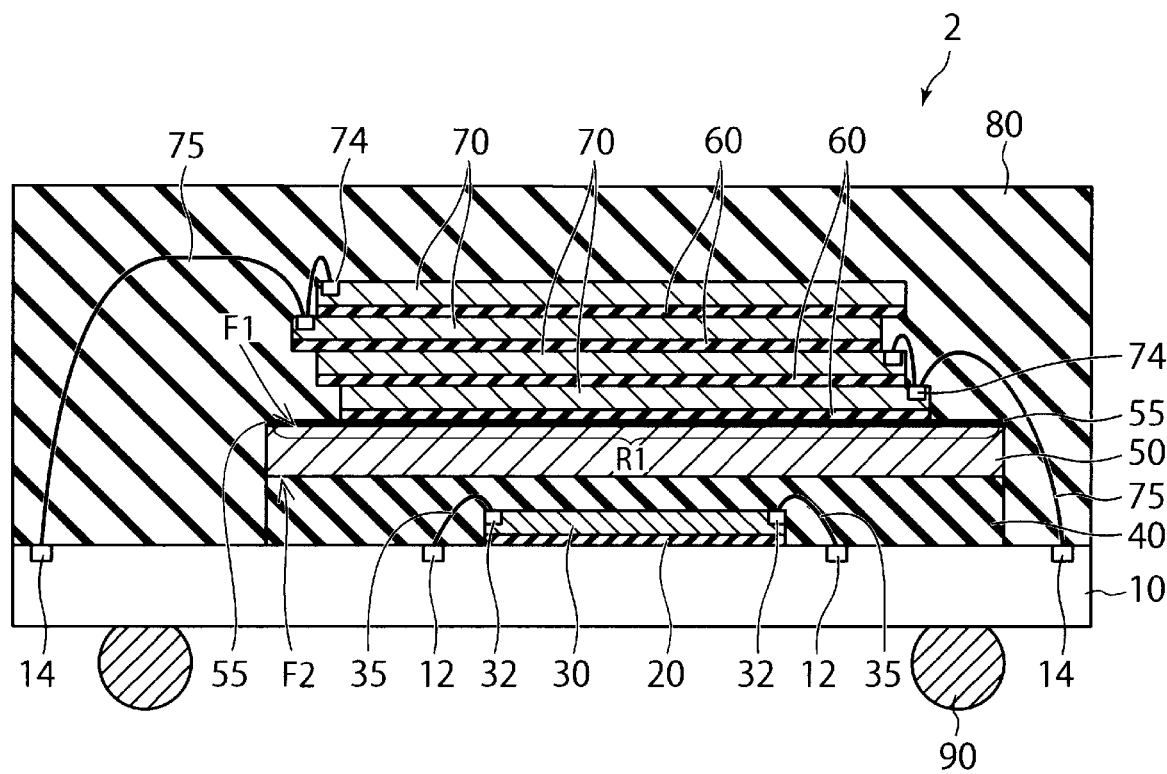
FIG. 5 is a cross-sectional view showing a configuration of a semiconductor device according to a second embodiment.

FIG. 5 is a cross-sectional view showing a configuration of a semiconductor device 2 according to a second embodiment. According to the second embodiment, the spacer chip 50 has a first surface F1 on which the memory chips 70 are placed and a second surface F2 opposite to the first surface F1. The processed layer 55 is provided on the entire first surface F1 and the first region R1 is the entire first surface (i.e., the upper surface) F1. On the other hand, the second region R2 is formed on the second surface (i.e., the rear surface) F2 opposite to the first surface F1 and does not include the processed layer 55. Therefore, the processed layer 55 is provided not only on the interface between the mold resin 80 and the spacer chip 50 but also on an interface between the adhesive material 60 and the spacer chip 50. That is, the processed layer 55 is also provided below the memory chip 70. The other configurations in the second embodiment may be similar to the corresponding configurations in the first embodiment.

Furthermore, in a method of manufacturing the semiconductor device 2, the laser apparatus 99 may irradiate the entire first surface F1 of the spacer chip 50 with laser light in a process shown in FIG. 4A. The processed layer 55 is thereby formed on the entire first surface F1 of the spacer chip 50. The other processes in the method of manufacturing the semiconductor device 2 may be similar to the corresponding processes in the method of manufacturing the semiconductor device 1 according to the first embodiment. The second embodiment can thereby bring about similar advantageous effects to those of the first embodiment.

Third Embodiment

Figure 6:
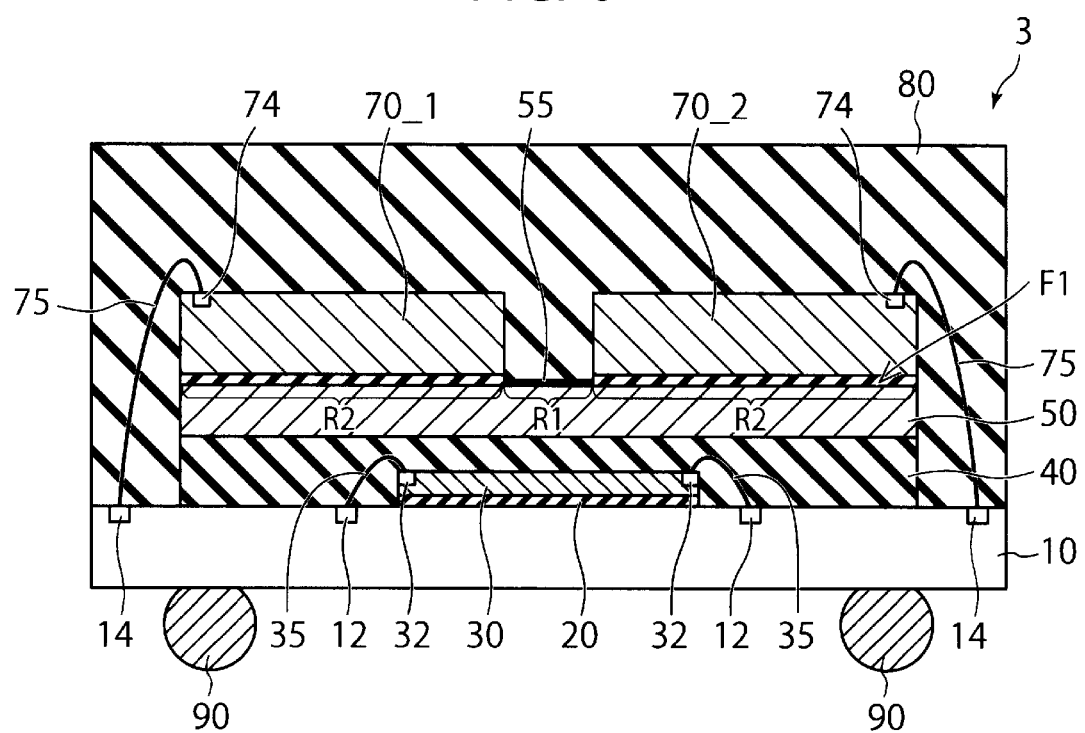
FIG. 6 is a cross-sectional view showing a configuration of a semiconductor device according to a third embodiment.
Figure 7:
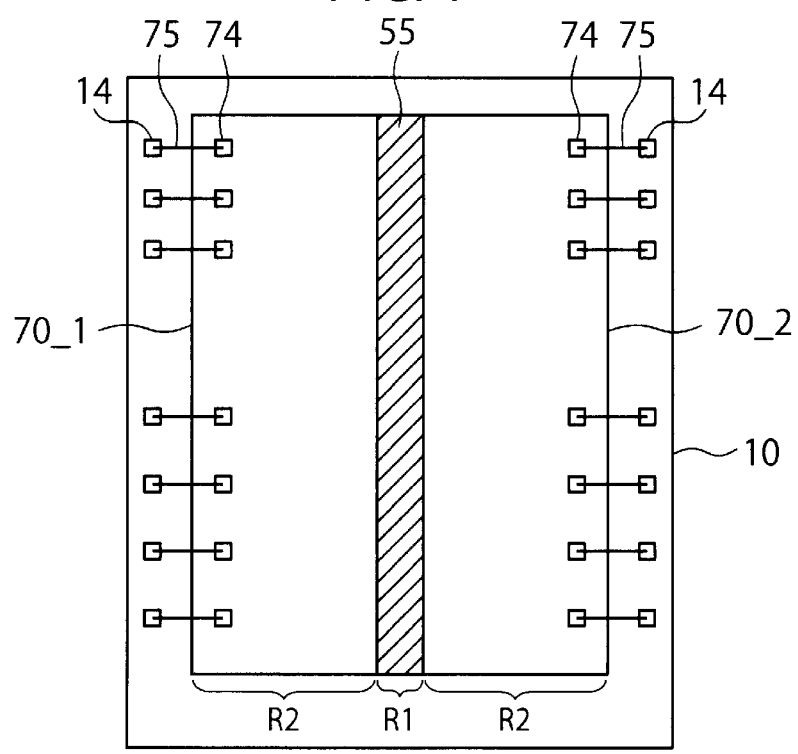
FIG. 7 is a plan view showing the configuration of the semiconductor device according to the third embodiment.

FIG. 6 is a cross-sectional view showing a configuration of a semiconductor device 3 according to a third embodiment. FIG. 7 is a plan view showing the configuration of the semiconductor device 3 according to the third embodiment. According to the third embodiment, memory chips 70_1 and 70_2 are disposed in parallel with each other on the first surface F1 of the spacer chip 50. A surface region of the spacer chip 50 present between the adjacent memory chips 70_1 and 70_2 is the first region R1. In the third embodiment, the first region R1 is located in an intermediate region of the spacer chip 50 and comes in direct contact with the mold resin 80 as shown in FIG. 7. The processed layer 55 is provided in the first region R1 of the spacer chip 50. The other configurations in the third embodiment may be similar to the corresponding configurations in the first embodiment.

Furthermore, in a method of manufacturing the semiconductor device 3, the laser apparatus 99 may irradiate the first surface F1 present in an intermediate portion of the spacer chip 50 with laser light. The other processes in the method of manufacturing the semiconductor device 3 may be similar to the corresponding processes in the method of manufacturing the semiconductor device 1 according to the first embodiment. The third embodiment can thereby bring about similar advantageous effects to those of the first embodiment.

In FIG. 6, the memory chips 70_1 and 70_2 are each provided on the spacer chip 50 as a single-layer memory chip. Alternatively, the memory chips 70_1 and 70_2 may be each a stacked body by stacking a plurality of memory chips. The other configurations in the third embodiment may be similar to the corresponding configurations in the first embodiment. The third embodiment can thereby bring about similar advantageous effects to those of the first embodiment.

Moreover, in the third embodiment, the processed layer 55 may be provided on the entire first surface F1 similarly to the second embodiment. The third embodiment can thereby bring about similar advantageous effects to those of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate;
a first semiconductor chip on the substrate;
a first adhesive material on the first semiconductor chip;
a spacer chip on the first adhesive material;
a second adhesive material on the spacer chip;
a second semiconductor chip on the second adhesive material; and
a resin material that covers the first and second semiconductor chips and the spacer chip, wherein
the spacer chip has a first region with which the resin material comes in contact that is roughened and a second region that is different from the first region, wherein
the first region has a larger amount of oxide than the second region.

2. The semiconductor device according to claim 1, wherein
the first and second regions are arranged on a surface of the spacer chip above which the second semiconductor chip is arranged, and
the second semiconductor chip is arranged above the second region via the second adhesive material.

3. The semiconductor device according to claim 1, wherein
the spacer chip has a first surface above which the second semiconductor chip is arranged via the second adhesive material and a second surface opposite to the first surface,
the first surface includes the first region, and
the second surface includes the second region.

4. The semiconductor device according to claim 1, wherein
the second semiconductor chip is a memory chip, and
the first semiconductor chip is a controller chip configured to control the memory chip.

5. The semiconductor device according to claim 1, wherein
an area of the first semiconductor chip on the substrate is less than an area of the spacer chip on the first adhesive layer.

6. The semiconductor device according to claim 1, further comprising:
a metal wire connecting the substrate and the second semiconductor chip over the first region.

7. A semiconductor device comprising:
a substrate;
a first semiconductor chip on the substrate;
a first adhesive material on the first semiconductor chip;
a spacer chip on the first adhesive material;
a second adhesive material on the spacer chip;
a second semiconductor chip on the second adhesive material; and
a resin material that covers the first and second semiconductor chips and the spacer chip, wherein
the spacer chip has a first region with which the resin material comes in contact that is roughened and a second region that is different from the first region, wherein
the first region has a larger amount of carbide than the second region.

8. The semiconductor device according to claim 7, wherein
the first and second regions are arranged on a surface of the spacer chip above which the second semiconductor chip is arranged, and
the second semiconductor chip is arranged above the second region via the second adhesive material.

9. The semiconductor device according to claim 7, wherein
the spacer chip has a first surface above which the second semiconductor chip is arranged via the second adhesive material and a second surface opposite to the first surface,
the first surface includes the first region, and
the second surface includes the second region.

10. The semiconductor device according to claim 7, wherein
the second semiconductor chip is a memory chip, and
the first semiconductor chip is a controller chip configured to control the memory chip.

11. The semiconductor device according to claim 7, wherein
an area of the first semiconductor chip on the substrate is less than an area of the spacer chip on the first adhesive layer.

12. The semiconductor device according to claim 7, further comprising:
a metal wire connecting the substrate and the second semiconductor chip over the first region.

13. A semiconductor device comprising:
a substrate;
a first semiconductor chip on the substrate;
a first adhesive material on the first semiconductor chip;
a spacer chip on the first adhesive material;
a second adhesive material on the spacer chip;
a second semiconductor chip on the second adhesive material; and
a resin material that covers the first and second semiconductor chips and the spacer chip, wherein
the spacer chip has a first region at which the resin material comes in contact,
the first region is rougher than a second region,
the spacer chip has a first surface above which the second semiconductor chip is arranged via the second adhesive material and a second surface opposite to the first surface,
the first surface includes the first region and the second region, and
the first region is made of oxide or carbide materials.

14. The semiconductor device according to claim 13, wherein
the second semiconductor chip is a memory chip, and
the first semiconductor chip is a controller chip configured to control the memory chip.

15. The semiconductor device according to claim 13, wherein
an area of the first semiconductor chip on the substrate is less than an area of the spacer chip on the first adhesive layer.

16. The semiconductor device according to claim 13, further comprising:
a metal wire connecting the substrate and the second semiconductor chip over the first region.

* * * * *